United States Patent
Chu

(12) United States Patent (10) Patent No.: US 7,019,594 B2
Chu (45) Date of Patent: Mar. 28, 2006

(54) METHOD AND APPARATUS FOR ANALYZING PERFORMANCE OF A MULTI-STAGE RADIO FREQUENCY AMPLIFIER

(75) Inventor: Chun Hsueh Chu, Taipei (TW)

(73) Assignee: Richwave Technology Corp., Taipei (TW)

( * ) Notice: Subject to any disclaimer, the term of this patent is extended or adjusted under 35 U.S.C. 154(b) by 34 days.

(21) Appl. No.: 10/775,198

(22) Filed: Feb. 11, 2004

(65) Prior Publication Data

US 2005/0073365 A1 Apr. 7, 2005

(30) Foreign Application Priority Data

Oct. 3, 2003 (TW) .............................. 92127461 A

(51) Int. Cl.
*H03F 3/04* (2006.01)
*H03F 3/191* (2006.01)

(52) U.S. Cl. ................. 330/302; 330/304; 330/305; 330/306; 330/310

(58) Field of Classification Search ............... 330/302, 330/304–306, 310
See application file for complete search history.

(56) References Cited

U.S. PATENT DOCUMENTS

| | | | | |
|---|---|---|---|---|
| 5,457,427 A * | 10/1995 | Wong et al. | ................. | 330/302 |
| 5,661,434 A * | 8/1997 | Brozovich et al. | ............ | 330/51 |
| 5,889,434 A * | 3/1999 | Shimura et al. | ............ | 330/302 |
| 6,166,599 A * | 12/2000 | Aparin et al. | ............... | 330/149 |
| 6,603,359 B1 * | 8/2003 | Fujiwara et al. | ............ | 330/310 |
| 6,614,311 B1 * | 9/2003 | Takenaka | .................... | 330/302 |
| 6,812,794 B1 * | 11/2004 | Mori et al. | ................. | 330/302 |
| 2003/0222709 A1 * | 12/2003 | Kim | ........................... | 330/51 |

* cited by examiner

*Primary Examiner*—Peguy Jeanpierre
*Assistant Examiner*—Khai Nguyen
(74) *Attorney, Agent, or Firm*—Troxell Law Office, PLLC

(57) ABSTRACT

A method and an apparatus for analyzing performance of a multi-stage radio frequency amplifier are described. The method simplifies the multi-stage radio frequency amplifier into equivalent input parts, output parts and mid-stage parts. The mid-stage parts are temporarily unset. Therefore, the equivalent input parts and output parts will be adjusted to make best gain performance and the mid-stage parts will be the next targets for analysis. Repeating the above-mentioned methods for decomposing the circuit can systemize the method for analyzing circuits and problems in each part of the circuit may be found more quickly.

13 Claims, 8 Drawing Sheets

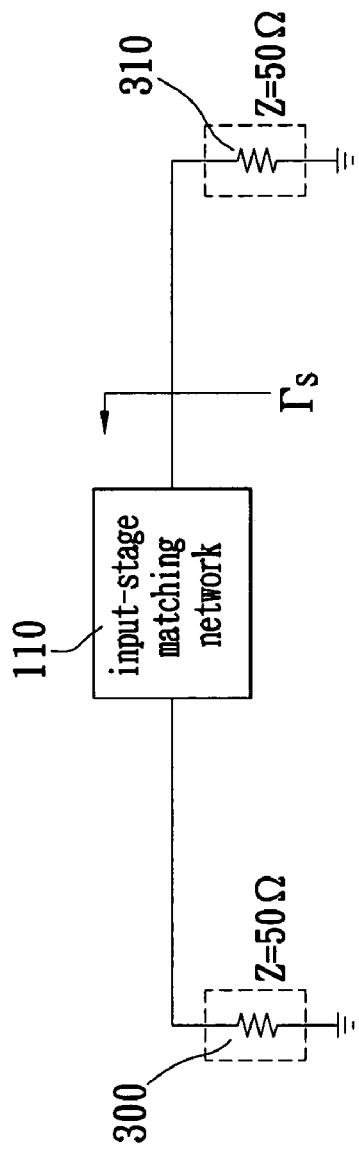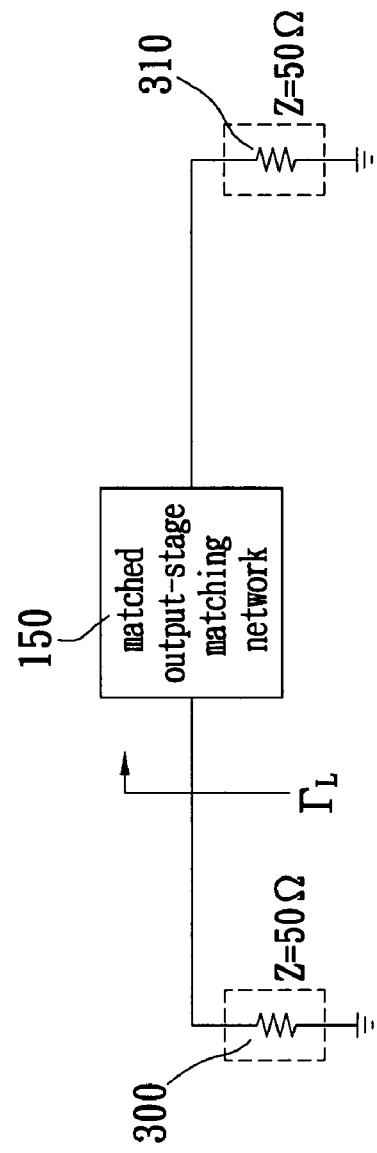

METHOD AND APPARATUS FOR ANALYZING PERFORMANCE OF A MULTI-STAGE RADIO FREQUENCY AMPLIFIER

BACKGROUND OF THE INVENTION

1. Field of the Invention

The present is related to a method and an apparatus for analyzing performance of a multi-stage radio frequency amplifier, and especially to a systematic method for rapidly analyzing stage gain and loss of each amplifier.

2. Description of Related Art

Radio frequency amplifiers are important in the design of radio frequency integrate circuits. When circuits are operated under microwave and radio frequencies, circuits with mismatched impedances suffer from decay and loss of power gain.

FIG. 1 shows a prior art single-stage radio frequency amplifier, which comprises an input power source circuit 010, an input-stage matching network 030, a single-stage amplifier 050, an output-stage matching network 070 and an output circuit 090. The input power source circuit 010 further includes an input source 012 and an input power source characteristic impedance 014; the impedance value of the input power source characteristic impedance 014 is 50 ohms.

The prior art method for analyzing the single-stage radio frequency amplifier is to find a reflection coefficient $\Gamma_S$ of a power source terminal, a reflection coefficient $\Gamma_L$ of the load, an input reflection coefficient $\Gamma_{IN}$, and an output reflection coefficient $\Gamma_{OUT}$. The four coefficients can be adjusted for acquiring preset gain value.

Matching methods in producing multi-stage radio integrate circuits are important issues in recent years. Prior art methods for analyzing power gain are designed for single-stage radio frequency amplifiers and microwave amplifiers; effective methods for analyzing power loss of multi-stage radio frequency amplifiers have not yet been successfully proposed. A common method applied for analyzing a multi-stage radio frequency amplifier is trial and error, but this wastes time and is ineffective. Prior art circuit simulation methods are hard to use in accounting for the reason why power gain decays.

SUMMARY OF THE INVENTION

The present invention is related to a method and an apparatus for analyzing performance of a multi-stage radio frequency amplifier. The apparatus comprises an input-stage matching network, a mid-stage network, an output-stage matching network and an output circuit. The method mainly includes the following steps: targeting a circuit network for analyzing, and treating non-analyzed circuit networks as mid-stage networks.

Reflection coefficients $\Gamma_S$ and $\Gamma_L$ of the targeted circuit network are obtained first, and then a power source matching network maximum gain $G_{Smax}$ and a load matching network maximum gain $G_{Lmax}$ are obtained with a Smith chart. A power source matching network maximum gain $G_{SMAX}$ of the input-stage matching network and a load matching network maximum gain $G_{LMAX}$ of the output-stage matching network can be made by adjusting the reflection coefficients $\Gamma_S$ and $\Gamma_L$.

Circuit networks will be neglected after analysis, and non-analyzed circuit networks are decomposed into equivalent circuit parts. One part is targeted for analysis; and the remaining parts are all viewed as a mid-stage network.

Repeating the above-mention steps for analysis will simplify the complexity of the circuit, and the power decays in circuit networks may be found more rapidly.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein:

FIG. 4A shows a device for obtaining a reflection coefficient $\Gamma_S$ of a power source;

FIG. 4B shows a device for obtaining a reflection coefficient $\Gamma_L$ of a load;

DETAILED DESCRIPTION OF PREFERRED EMBODIMENTS

The object of the present invention is to provide a method and an apparatus for analyzing a multi-stage radio frequency amplifier, and finding decay in the multi-stage radio frequency amplifier.

Figure 1:
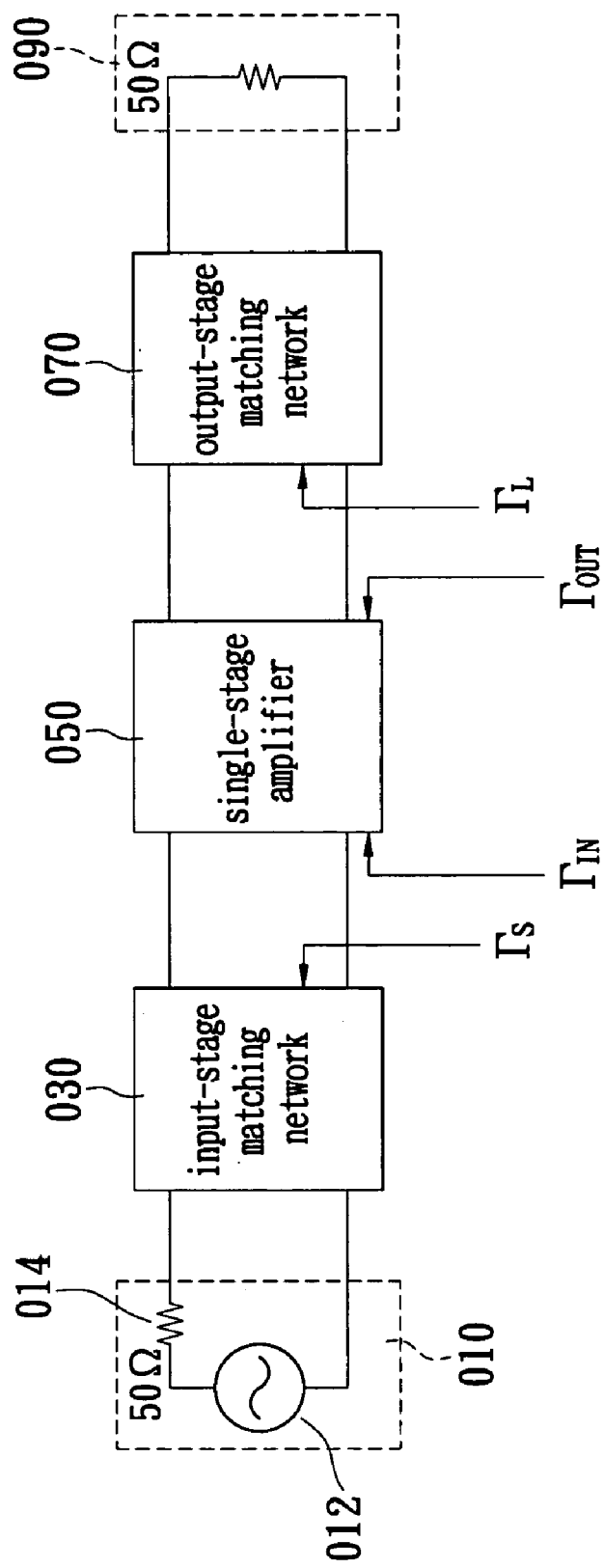
FIG. 1 shows a prior art circuit.
Figure 2:
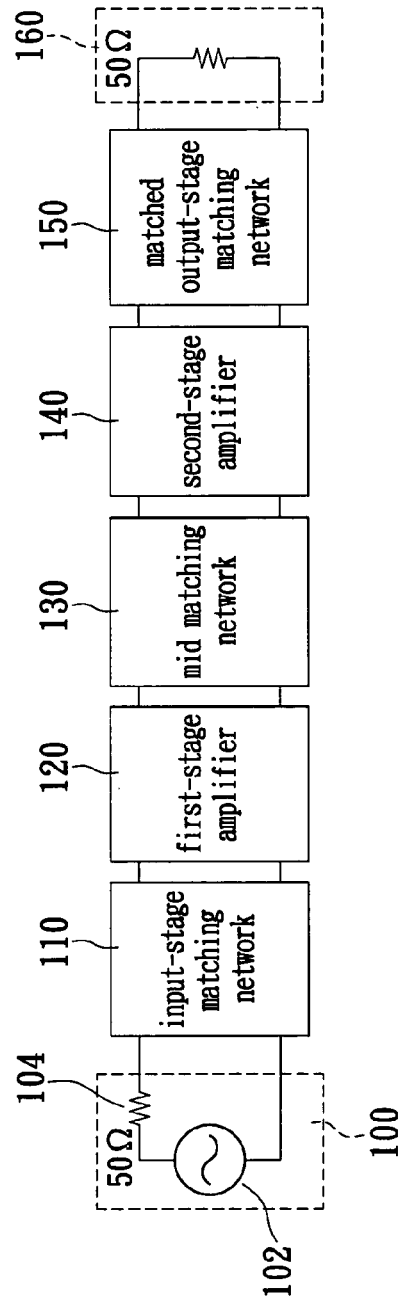
FIG. 2 shows a first embodiment according to the present invention.

FIG. 2 shows a first embodiment of the present invention. The multi-stage radio frequency amplifier of the present invention includes an input power source circuit 100, an input-stage matching network 110, a first-stage amplifier 120, a mid matching network 130, a second-stage amplifier 140, an output-stage matching network 150, and an output circuit 160 (may be an impedance with 50 ohms). The input power source circuit 100 comprises a power generating device 102 and an input characteristic impedance 104 (usual value of the impedance is 50 ohms). The mid matching network 130 is provided between a first-stage amplifier 120 and a second-stage amplifier 140.

Figure 3:
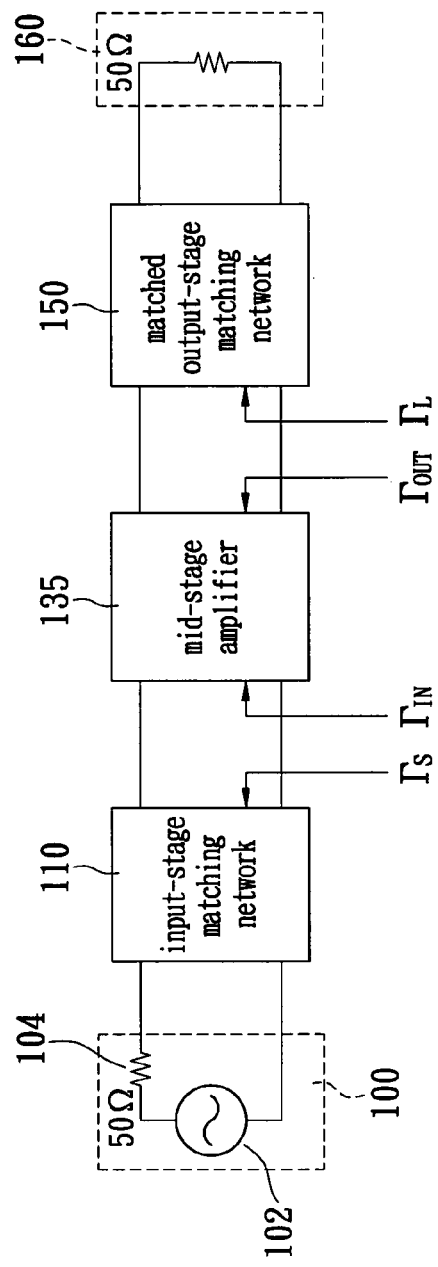
FIG. 3 depicts a simplified circuit of the first embodiment according to the present invention.

Reference is made to FIG. 3. The above-mentioned first-stage amplifier 120, the second-stage amplifier 140 and the mid matching network 130 are combined into a mid-stage amplifier 135; therefore, the complexity of amplifier analysis can be simplified. A reflection coefficient $\Gamma_S$ of the input-stage matching network 110 and a loading reflection coefficient $\Gamma_L$ of the output-stage matching network 150 will be obtained; the reflection coefficient $\Gamma_S$ of the input-stage matching network 110 is then adjusted to be $\Gamma_{S,max}$ for conjugate matching with an input reflection coefficient $\Gamma_{IN}$ of the mid-stage amplifier 135. The loading reflection coefficient $\Gamma_L$ of output-stage matching network 150 is adjusted to be $\Gamma_{L,max}$ for conjugate matching with an output reflection coefficient $\Gamma_{OUT}$ of the mid-stage matching network.

Two formulas are provided for obtaining a power source gain $G_S$ of input-stage matching network and loading gain $G_L$. Reflection coefficient $\Gamma_S$, the reflection coefficient $\Gamma_L$, the input reflection coefficient $\Gamma_{IN}$, and the output reflection coefficient $\Gamma_{OUT}$ are used as parameters.

$$G_S = \frac{1-|\Gamma_S|^2}{|1-\Gamma_S\Gamma_{IN}|^2} \qquad G_L = \frac{1-|\Gamma_L|^2}{|1-\Gamma_{OUT}\Gamma_L|^2}$$

A power source maximum gain $G_{Smax}$ and a loading maximum gain $G_{Lmax}$ can be obtained by adjusting the reflection coefficient $\Gamma_S$ and the reflection coefficient $\Gamma_L$; a power circle of a Smith chart will show the value of $G_{Smax}$ and $G_{Lmax}$. Thus, the best power transferring rate and lowest gain loss will be made. Further, the difference between the power source gain $G_S$ and the power source maximum gain $G_{Smax}$ is the loss of power gain due to unmatched input-stage impedance; and the difference between loading gain $G_L$ and loading maximum gain $G_{Lmax}$ is loss of power gain due to unmatched output-stage impedance.

Reference is made to FIG. 4A, it shows the method for obtaining the above-mentioned reflection coefficient $\Gamma_S$ of the input-stage matching network 110, wherein an input characteristic impedance 300 and an output characteristic impedance 310 are both 50 ohms. Incident wave intensity and reflection wave intensity may be measured at first, and the reflection coefficient $\Gamma_S$ of the power source will be gained by calculating the ratio of them.

Reference is made to FIG. 4B, which shows the method for obtaining the above-mentioned reflection coefficient $\Gamma_L$ of the output-stage matching network 150. An input characteristic impedance 300 and an output characteristic impedance 310 are both given as 50 ohms. Incident wave intensity and reflection wave intensity may be measured at first, and the reflection coefficient $\Gamma_L$ of the power source will be gained by calculating the ratio thereof.

Figure 5A:
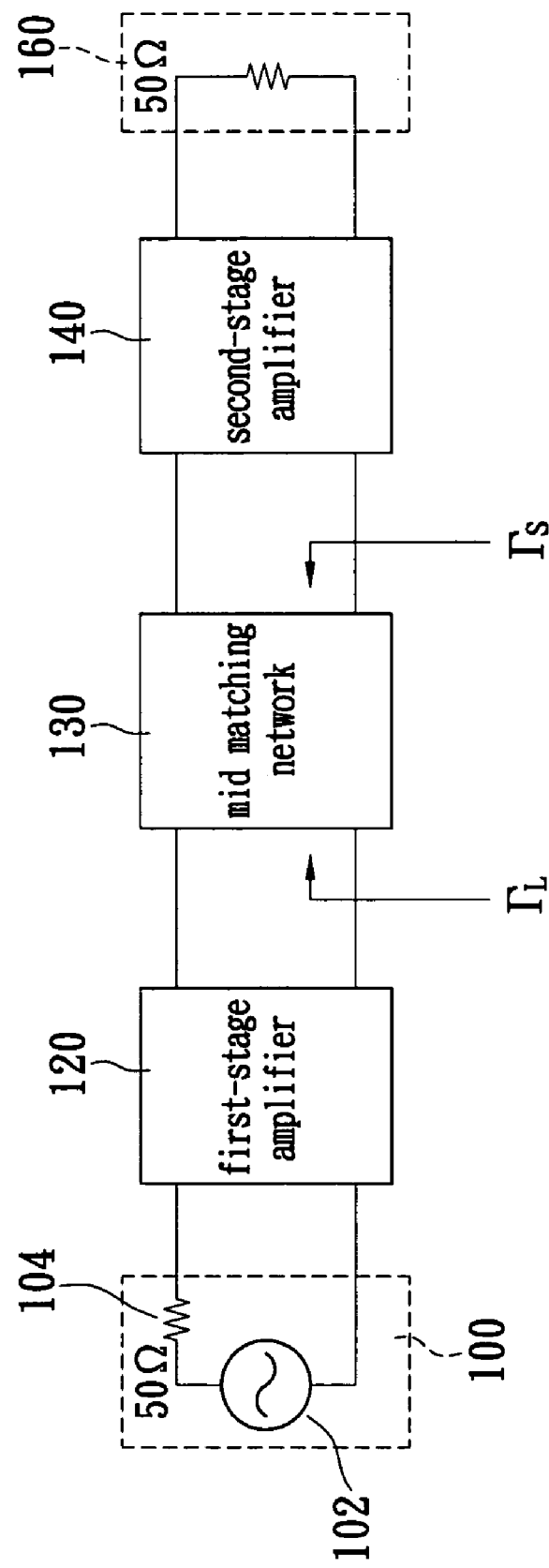
FIG. 5A shows another simplified circuit of the first embodiment according to the present invention.

Reference is made to FIG. 5A; after analyzing FIG. 2, the mid-stage amplifier is restored to the original first-stage amplifier 120, the mid matching network 130, and the second-stage amplifier 140. The matched input-stage matching network 110 and the matched output-stage matching network 150 are neglected. This method is undisclosed in prior art method for analyzing radio frequency and microwave amplifiers.

Figure 5B:
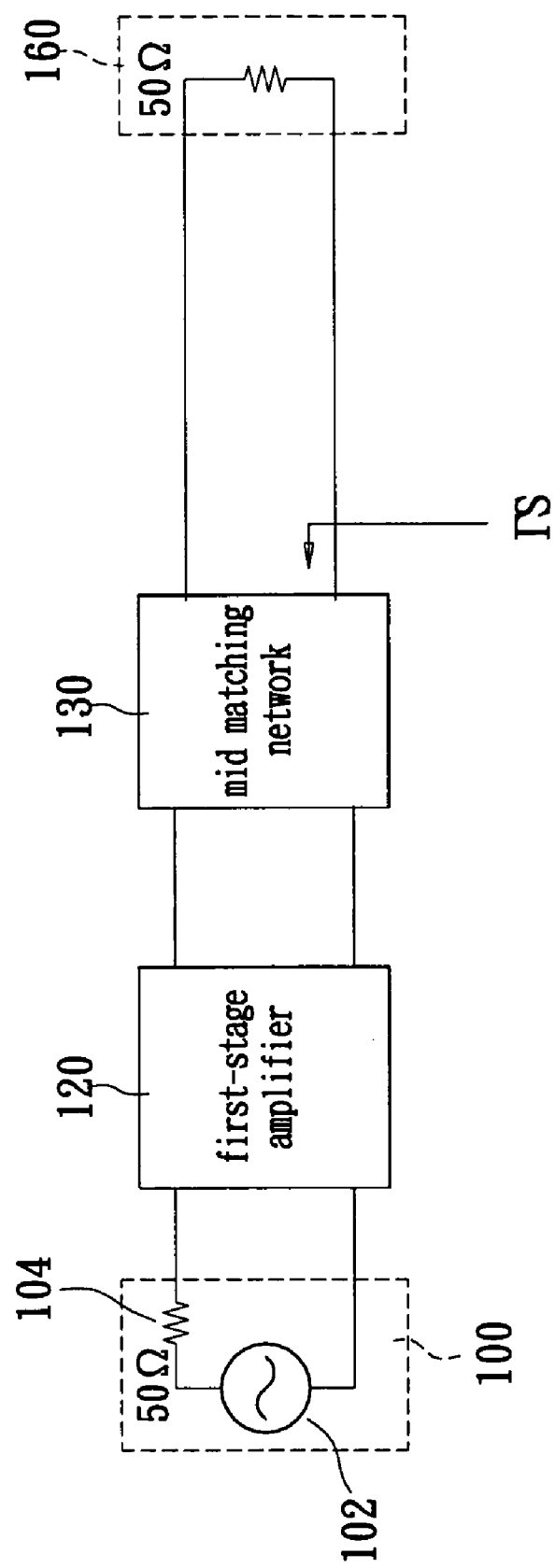
FIG. 5B shows another simplified circuit of the first embodiment according to the present invention for obtaining a reflection coefficient $\Gamma_S$ of a power source.

Gain of the first-stage amplifier 120 is a fixed value $G_{01}$ (gain $S_{21}$ (dB) is measured when impedances at two terminals are both 50 ohms, where $S_{21}$ is the ratio of output power and input power); and gain of the second stage amplifier 140 is a fixed value $G_{02}$ (gain $S_{21}$ (dB) is measured when impedances at two terminals are both 50 ohms). Because the mid matching network 130, the second-stage amplifier 140 and the output circuit 160 can be viewed as an output load of the first-stage amplifier, the reflection coefficient $\Gamma_L$ of the load is obtained by the method shown in FIG. 5C. Similarly, the mid matching network 130, the first-stage amplifier 120 and the output circuit 100 can be treated as an input load of the second-stage amplifier, and the reflection coefficient $\Gamma_S$ of the power source is obtained by the method shown in FIG. 5B. Thus, the corresponding load matching network gain $G_L$ and the power source matching network gain $G_S$ can be obtained by applying above-mentioned two methods.

A power source maximum gain $G_{Smax}$ and a loading maximum gain $G_{Lmax}$ can be obtained by adjusting the power source reflection coefficient $\Gamma_S$ of the mid matching network of the second-stage amplifier and the loading reflection coefficient $\Gamma_L$ of the mid matching network of first-stage amplifier; an optimal gain may be acquired by Smith chart. The difference between the power source gain $G_S$ and the power source maximum gain $G_{Smax}$ is the loss of power gain due to the first-stage amplifier 120 being unmatched by mid matching network 130; and the difference between loading gain $G_L$ and loading maximum gain $G_{Lmax}$ is loss of power gain due to the second-stage amplifier 140 being unmatched with the mid matching network 130. So, adjusting the mid matching network 130 can obtain the maximum gain and least loss.

Figure 5C:
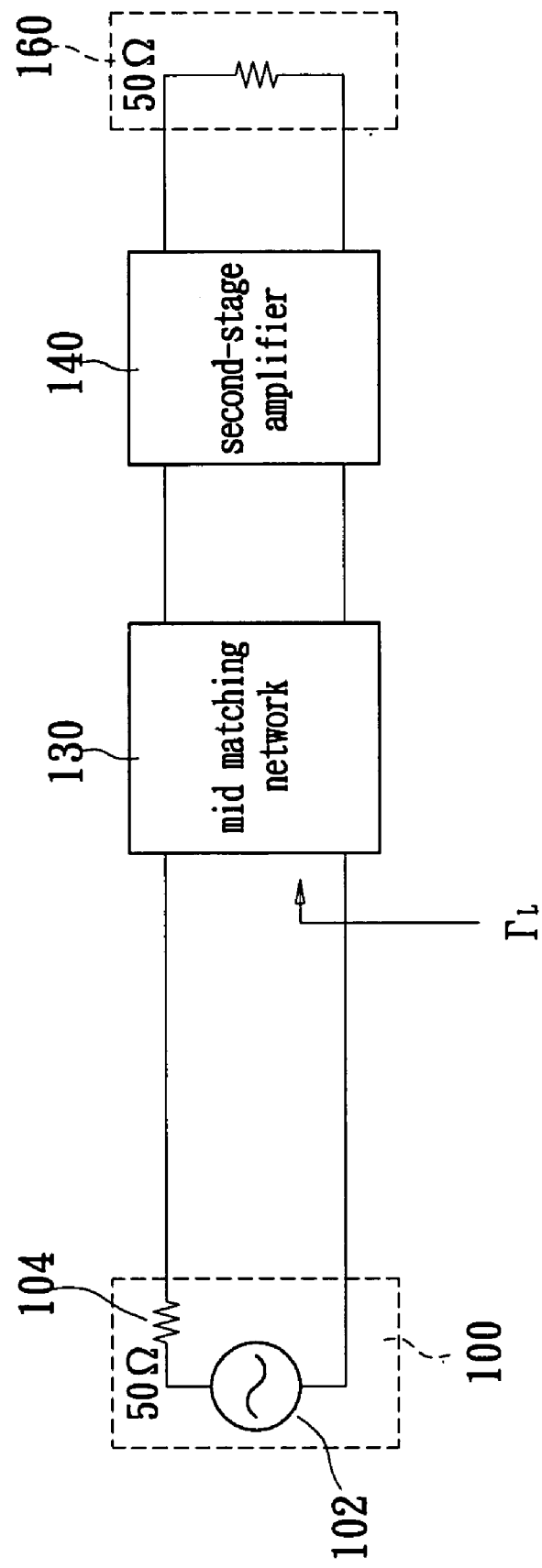
FIG. 5C shows another simplified circuit of the first embodiment according to the present invention for obtaining a reflection coefficient $\Gamma_L$ of a load.
Figure 6:
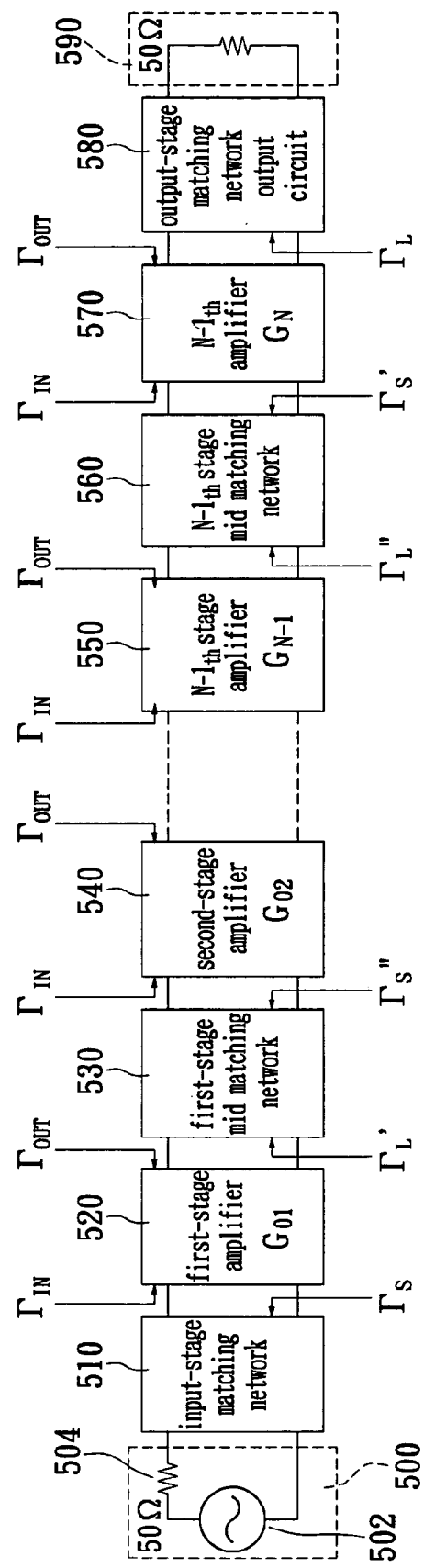
FIG. 6 shows a second embodiment according to the present invention.

Reference is made to FIG. 6, which shows another embodiment of the present invention where the circuit may be analyzed by using the methods provided in FIG. 4A, FIG. 4B, FIG. 5B, FIG. 5C. An input power source circuit 500 depicted in FIG. 6 includes a power generating device 502, and an input characteristic impedance 504. An input-stage matching network 510 is connected to the input power source circuit 500 and the first-stage amplifier 520, a first stage amplifier 520 is connected behind the input-stage matching network 510, and a first-stage mid matching network 530 is set between the first-stage amplifier 520 and the second-stage amplifier 540. Each stage amplifier is therefore connected one by one and there is a corresponding mid-stage matching network set between every two stage amplifiers. Finally, an Nth stage amplifier is connected to an output-stage matching network 580 and an output circuit 590. The output circuit 590 may have a characteristic impedance (50 ohms).

In this embodiment according to the present invention, gain ($G_{01}$, $G_{02}$, $G_{03}$, to $G_N$) of each stage amplifier is analyzed with scattering parameters and uses an impedance of 50 ohms. The reflection coefficients $\Gamma_S$ of the power source terminal of the mid-stage matching network and of each stage amplifier, as well as a reflection coefficient $\Gamma_L$ of a load, are obtained in sequence by the above-mentioned methods.

Additionally, the first-stage amplifier 520, the first-stage mid matching network 530, the second-stage amplifier 540, a N–1$_{th}$ stage amplifier 550, a N–1$_{th}$ stage mid matching network 560 and a N$_{th}$ amplifier 570 are all treated as an N$_{th}$ stage mid stage amplifier. Then, a reflection coefficient $\Gamma_S$ of a power source of the input-stage matching network 510 is adjusted to be $\Gamma_{S,max}$ for conjugate matching with an input reflection coefficient $\Gamma_{IN}$ of the first stage amplifier 520 and a loading reflection coefficient $\Gamma_L$ of an output-stage matching network 580 is adjusted to be $\Gamma_{L,max}$ for conjugate matching with an output reflection coefficient $\Gamma_{OUT}$ of the N$_{th}$ amplifier 570. The maximum gain $G_{Smax}$ of the input-stage matching network 510 and the maximum gain $G_{Lmax}$ of output-stage matching network 580 can be obtained with a Smith chart.

After the maximum gain $G_{Smax}$ of the input-stage matching network 510 and the maximum gain $G_{Lmax}$ of output-stage matching network 580 are acquired, the above two matching network will be neglected. Next, the first-stage amplifier 520, the first-stage mid matching network 530, the second-stage amplifier 540, the (N–1)$_{th}$-stage amplifier 550, the (N–1)$_{th}$-stage mid matching network 560 and the N$_{th}$-stage amplifier 570 will be analyzed. The first-stage mid matching network 530, the second-stage amplifier 540, the (N–1)$_{th}$-stage amplifier 550, and the (N–1)$_{th}$-stage mid matching network 560 are again viewed as a mid multi-stage amplifier. A loading reflection coefficient $\Gamma_L'$ of the first-stage mid matching network 530 is obtained by regarding the mid multi-stage amplifier as a load of the first-stage amplifier. The power source reflection coefficient $\Gamma_S'$ of the (N−1)$_{th}$-stage mid matching network 560 is obtained by regarding the mid multi-stage amplifier as an input network of the N$_{th}$-stage amplifier. By adjusting a reflection coefficient $\Gamma_S'$ of a power source of the (N−1)$_{th}$ stage mid matching network to be $\Gamma_{S'max}$ for conjugate matching with an input reflection coefficient $\Gamma_{IN}$ of the N$_{th}$ stage amplifier 570 and adjusting a loading reflection coefficient $\Gamma_L'$ to be $\Gamma_{L'max}'$ for conjugate matching with an output reflection coefficient $\Gamma_{OUT}$ of the first amplifier 520, the input maximum gain $G_{S'max}$ of the N$_{th}$-stage amplifier 570 and the loading maximum gain $G_{L'max}$ of the first-stage matching network 520 can be obtained with a Smith chart.

To simplify the complexity of circuit analysis, the first-stage amplifier 520 and the N$_{th}$ stage amplifier 570 are neglected. the remaining part of the circuit is decomposed into a first-stage mid matching network, a multi-stage amplifier (including the second-stage amplifier 540, the (N−1)$_{th}$-stage amplifier 550 and other stage circuits, which are not shown) and a (N−1)$_{th}$-stage mid matching network.

A loading reflection coefficient $\Gamma_L''$ is obtained by regarding the (N−1)$_{th}$-stage mid matching network 560 as a load, and the input reflection coefficient $\Gamma_S''$ is obtained by regarding the first-stage mid matching network 530 as an input network of the N$_{th}$-stage amplifier. The reflection coefficient $\Gamma_S''$ is adjusted to be $\Gamma_{S''max}''$ for conjugate matching with an input reflection coefficient $\Gamma_{IN}$ of the second stage amplifier 540 and the loading reflection coefficient $\Gamma_L''$ to be $\Gamma_{L''max}''$ for conjugate matching with an output reflection coefficient $\Gamma_{OUT}$ of the (N−1)$_{th}$-stage amplifier 550. The input maximum gain $G_{S''max}$ of the second stage amplifier 540 and the loading maximum gain $G_{L''max}$ of the (N−1)$_{th}$-stage amplifier 550 can be obtained with a Smith chart.

Following the procedure described in conjunction with FIG. 4A, FIG. 4B, FIG. 5B, and FIG. 5C, analysis of the power gain and loss in mid matching network of each amplifier can be completed. At last, a maximum transducer power gain $G_{T,MAX}$ is made by adjusting the $\Gamma_S$ and $\Gamma_L$ of each matching network. Hence, using the above-mentioned methods can speed up the design of a circuit and find the reason why the gain of the circuit decays easily.

Figure 7:
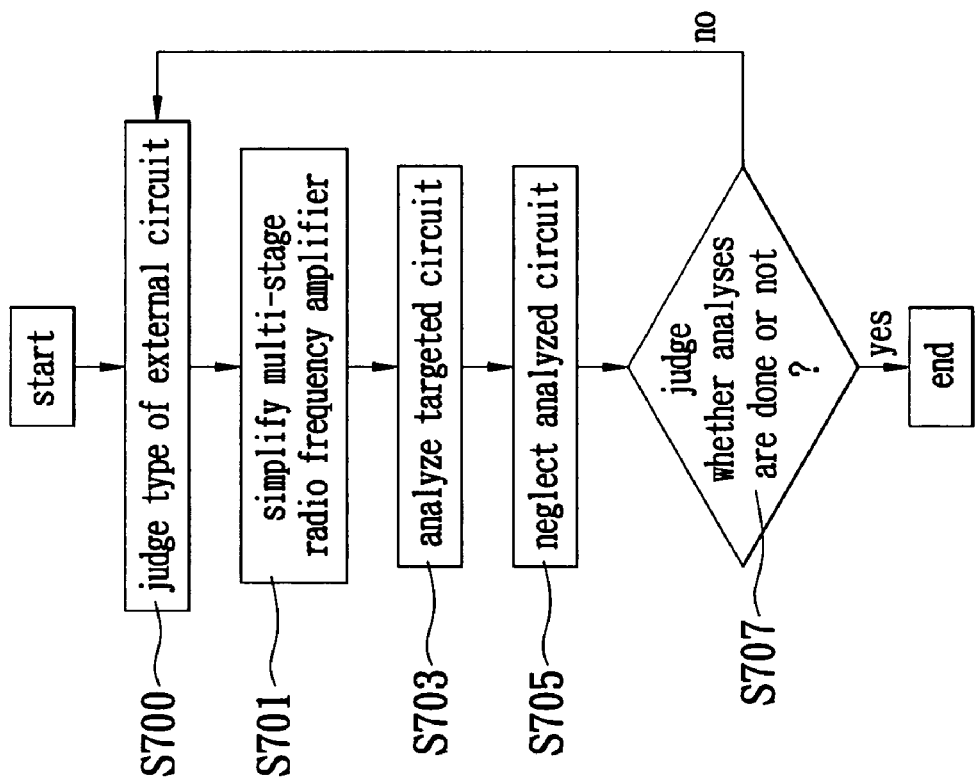
FIG. 7 shows a flow chart of the present invention.

FIG. 7 shows the flow chart of the present invention. A first step S700 is to identify whether the type of an external network of a multi-stage radio frequency amplifier is a matching stage network or amplifier stage network. Next step S701 simplifies the multi-stage radio frequency amplifier into a front-stage matching network, mid-stage amplifier, and a back-stage matching network if the external network is a matching network. If the external network is an amplifier network, the multi-stage radio frequency amplifier is simplified into a front-stage amplifier, mid-stage matching network, and a back-stage amplifier.

When the multi-stage radio frequency amplifier is simplified into the front-stage matching network, the mid-stage amplifier, and the back-stage matching network, a step S703 will analyze the simplified multi-stage radio frequency amplifier and a load reflection coefficient $\Gamma_L$ of the back stage matching network is obtained by the method shown in FIG. 4B. A power source reflection coefficient $\Gamma_S$ of the front-stage matching network is obtained by the method shown in FIG. 4A. Next, the reflection coefficient $\Gamma_S$ is adjusted to be $\Gamma_{S,max}$ for conjugate matching with an input reflection coefficient $\Gamma_{IN}$ of the mid stage amplifier and the load reflection coefficient $\Gamma_L$ of an back-stage matching network is adjusted to be $\Gamma_{L,max}$ for conjugate matching with an output reflection coefficient $\Gamma_{OUT}$ of the mid stage amplifier. The input maximum gain $G_{Smax}$ of the input-stage matching network and the loading maximum gain $G_{Lmax}$ of the output-stage matching network can be obtained by analyzing a power circle of a Smith chart.

When the multi-stage radio frequency amplifier is simplified into the front-stage amplifier, the mid-stage matching network, and the back-stage amplifier, the step S703 will analyze the simplified multi-stage radio frequency amplifier and a load reflection coefficient $\Gamma_L$ of the front-stage matching network is obtained by the method shown in FIG. 5C (the mid-stage matching network and the back-stage amplifier are viewed as a load for the front-stage amplifier). A power source reflection coefficient $\Gamma_S$ of the back-stage matching network is obtained by the method shown in FIG. 5B (the mid-stage matching network, and the front-stage amplifier are viewed as an power input network for the back-stage amplifier). Next, the input maximum gain $G_{Smax}$ of the back-stage matching network and the loading maximum gain $G_{Lmax}$ of the front-stage matching network will be made by regulating the mid-stage matching network.

After step S705, a step S707 is performed for judging whether all circuits have been analyzed or not. If yes, then the procedure is complete and all the circuit networks can make the input maximum gain $G_{Smax}$ and the loading maximum gain $G_{Lmax}$; the multi-stage radio frequency amplifier can also make a maximum transducer power gain $G_{T,MAX}$. If not, the procedure will return to the step S700 for analyzing unset circuits, and all above-mentioned methods are executed again until all circuits are set.

What is claimed is:

1. An apparatus for analyzing performance of a multi-stage radio frequency amplifier, comprising:
   an input power source circuit;
   a front-stage matching network receiving power provided by the input power source circuit;
   a mid-stage network connected in back of the front-stage matching network and receiving power transferred by the front-stage matching network, wherein a plurality of single-stage amplifiers and a plurality of mid-stage matching networks are in the mid-stage network;
   a back-stage matching network connected in back of the mid-stage network; and
   an output circuit connected in back of the back-stage matching network;
   wherein the mid-stage network further comprises a plurality of single-stage amplifiers and a plurality of mid-stage matching networks, and every mid-stage matching network is clipped between two single-stage amplifiers, wherein a power source terminal reflection coefficient $\Gamma_S$ of front stage matching network and a load reflection coefficient $\Gamma_L$ of the back stage matching network are obtained respectively, the power source terminal reflection coefficient $\Gamma_S$ is adjusted to be maximum power source terminal reflection coefficient $\Gamma_{S,max}$ for conjugate matching with an input reflection coefficient $\Gamma_{IN}$ of the mid-stage network, and the load reflection coefficient $\Gamma_L$ is also adjusted to be maximum load reflection coefficient $\Gamma_{L,max}$ for conjugate matching with an output reflection coefficient $\Gamma_{OUT}$ of mid-stage network.

2. The apparatus for analyzing performance of a multi-stage radio frequency amplifier as in claim 1, wherein the input power source circuit comprises a power generating device and an input characteristic impedance.

3. The apparatus for analyzing performance of a multi-stage radio frequency amplifier as in claim 1, wherein the output circuit is an output characteristic impedance with 50 ohms.

4. The apparatus for analyzing performance of a multi-stage radio frequency amplifier as in claim 1, wherein after the maximum gain of the input-stage matching network and of output-stage matching network are acquired, the above two matching network are neglected, and the mid-stage network is treated as a first-stage amplifier, a first-stage mid matching network and a second-stage amplifier.

5. The apparatus for analyzing performance of a multi-stage radio frequency amplifier as in claim 4, wherein gain values of the first-stage amplifier and of the second-stage amplifier are fixed.

6. The apparatus for analyzing performance of a multi-stage radio frequency amplifier as in claim 4, wherein a mid matching network gain $G_L$ and power source terminal mid-matching network $G_S$ are obtained by using the load reflection coefficient $\Gamma_L$ and the power source terminal reflection coefficient $\Gamma_S$, and a power source matching network maximum gain $G_{Smax}$ and a load matching network maximum gain $G_{Lmax}$ can be made by adjusting the power source terminal reflection coefficients $\Gamma_S$ and the load reflection coefficient $\Gamma_L$, respectively.

7. The apparatus for analyzing performance of a multi-stage radio frequency amplifier as in claim 5, wherein the first-stage amplifier with fixed gain value and the second-stage amplifier with fixed gain value are neglected, and the mid-matching network is viewed as a first-stage amplifier, a first-stage mid matching network and a second-stage amplifier.

8. The apparatus for analyzing performance of a multi-stage radio frequency amplifier as in claim 7, wherein the power source terminal reflection coefficients $\Gamma_S$, and the load reflection coefficient $\Gamma_L$, are measured from an end of the first mid-matching network and an end of the second mid-matching network, respectively.

9. A method for analyzing performance of a multi-stage radio frequency amplifier, wherein the application comprises improving a prior art trial and error method, the method providing:

identifying whether an unset external network is either a matching network or an amplifier network;

simplifying the multi-stage radio frequency amplifier, wherein the multi-stage radio frequency amplifier is decomposed into a front-stage matching network, a mid-stage network and a back-stage matching network when an external network of the multi-stage radio frequency amplifier is a matching network, and the multi-stage radio frequency amplifier is decomposed into a front-stage amplifier, a mid-stage matching network and a back-stage amplifier;

adjusting a power source terminal reflection coefficient $\Gamma_S$ to be a maximum power source terminal reflection coefficient $\Gamma_{S,max}$ for conjugate matching with an input reflection coefficient $\Gamma_{IN}$;

adjusting a load reflection coefficient $\Gamma_L$ to be a maximum load reflection coefficient $\Gamma_{L,max}$ for conjugate matching with an output reflection coefficient $\Gamma_{OUT}$; and repeating said above-mentioned steps on non-analyzing networks until all of networks are set.

10. The method for analyzing performance of a multi-stage radio frequency amplifier as in claim 9, wherein the method analyzes the simplified power source terminal reflection coefficient $\Gamma_S$ of the front-stage matching network of the multi-stage radio frequency amplifier and the simplified back-stage matching network load reflection coefficient $\Gamma_S$.

11. The method for analyzing performance of a multi-stage radio frequency amplifier as in claim 10, wherein the method further provides:

measuring first-stage amplifier gain $G_{01}$, second-stage amplifier $G_{02}$, third-stage amplifier gain $G_{03}$ . . . , Nth-stage amplifier gain $G_N$ as well as the input reflection coefficient $\Gamma_{IN}$ and output reflection coefficient $\Gamma_{OUT}$ by using a 50 ohms impedance; and obtaining the power source terminal reflection coefficient $\Gamma_S$ and the load reflection coefficient $\Gamma_L$ of each mid-stage matching network.

12. The method for analyzing performance of a multi-stage radio frequency amplifier as in claim 9, wherein the method further provides:

obtaining an input terminal reflection coefficient $\Gamma_S$ of a mid-stage matching network and a load reflection coefficient $\Gamma_L$;

obtaining a power source matching network gain $G_S$ and a load matching network gain $G_L$;

modulating the power source matching network gain $G_S$ to be a power source matching network maximum gain $G_{Smax}$ and the load matching network gain GL to be a load matching network maximum gain $G_{Lmax}$ by adjusting the reflection coefficient $\Gamma_S$ and the reflection coefficient $\Gamma_L$, respectively; and deriving maximum transferring rate and less gain loss.

13. The method for analyzing performance of a multi-stage radio frequency amplifier as in claim 9, wherein the method further provides:

identifying the accomplishment of analyzing the multi-stage radio frequency amplifier for a jump procedure;

re-executing the above-mentioned procedures when analysis of the multi-stage radio frequency amplifier is not performed; and performing the jump procedure when analysis of the multi-stage radio frequency amplifier is complete.

* * * * *